United States Patent
Souma et al.

(10) Patent No.: US 7,615,839 B2
(45) Date of Patent: Nov. 10, 2009

(54) SEMICONDUCTOR DEVICE AND MANUFACTURING METHOD THEREOF

(75) Inventors: Tadaaki Souma, Saitama (JP); Tadashi Natsume, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 633 days.

(21) Appl. No.: 11/058,427

(22) Filed: Feb. 16, 2005

(65) Prior Publication Data

US 2005/0194610 A1 Sep. 8, 2005

(30) Foreign Application Priority Data

Feb. 24, 2004 (JP) ............................. 2004-048256

(51) Int. Cl.
*H01L 29/47* (2006.01)
(52) U.S. Cl. .................... 257/473; 257/485; 257/763; 438/570; 438/582; 438/656
(58) Field of Classification Search .............. 257/256, 257/260, 261, 471–473, 478, 479, 474, 477, 257/485, 770, 763, 764; 438/92, 167, 570, 438/580, 581, 582, 575, 170, 309, 683, 685, 438/648, 656
See application file for complete search history.

(56) References Cited

U.S. PATENT DOCUMENTS

| | | | | |
|---|---|---|---|---|
| 3,982,264 A | * | 9/1976 | Ishitani | 257/266 |
| 4,641,174 A | * | 2/1987 | Baliga | 257/264 |
| 5,017,976 A | * | 5/1991 | Sugita | 257/494 |
| 5,371,400 A | * | 12/1994 | Sakurai | 257/478 |
| 5,789,311 A | * | 8/1998 | Ueno et al. | 438/573 |
| 6,936,850 B2 | * | 8/2005 | Friedrichs et al. | 257/77 |
| 7,141,861 B2 | * | 11/2006 | Takayama | 257/485 |
| 2001/0005031 A1 | * | 6/2001 | Sakamoto et al. | 257/401 |
| 2003/0020136 A1 | * | 1/2003 | Kitabatake et al. | 257/502 |

(Continued)

FOREIGN PATENT DOCUMENTS

JP 06-151816 A 5/1994

(Continued)

*Primary Examiner*—Thao X Le
*Assistant Examiner*—Thanh Y Tran
(74) *Attorney, Agent, or Firm*—Morrison & Foerster LLP

(57) ABSTRACT

Since VF and IR characteristics of a Schottky barrier diode are in a trade-off relationship, there has heretofore been a problem that an increase in a leak current is unavoidable in order to realize a low VF. Moreover, there has been a known structure which suppresses the leak current in such a manner that a depletion layer is spread by providing P+ regions and a pinch-off effect is utilized. However, in reality, it is difficult to completely pinch off the depletion layer. P+ type regions are provided, and a low VF Schottky metal layer is allowed to come into contact with the P+ type regions and depletion regions therearound. A low IR Schottky metal layer is allowed to come into contact with a surface of a N type substrate between the depletion regions. When a forward bias is applied, a current flows through the metal layer of low VF characteristic. When a reverse bias is applied, a current path narrowed by the depletion regions is formed only in the metal layer portion of low IR characteristic. Thus, a low VF and low IR Schottky barrier diode can be realized.

6 Claims, 7 Drawing Sheets

U.S. PATENT DOCUMENTS

2003/0057482 A1* 3/2003 Harada ............... 257/329
2004/0061195 A1* 4/2004 Okada et al. ............ 257/477

FOREIGN PATENT DOCUMENTS

| JP | 06-224410 | 8/1994 |
| JP | 2000-261004 | 9/2000 |
| JP | 2003-158259 | 5/2003 |

* cited by examiner

Prior Art

Prior Art

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, more particularly relates to a semiconductor device capable of improving low forward voltage and low leak current characteristics of a Schottky barrier diode, and a manufacturing method thereof.

2. Description of the Related Art

FIGS. 6A and 6B show a conventional Schottky barrier diode 110. FIG. 6A is a plan view, and FIG. 6B is a cross-sectional view along the line C-C in FIG. 6A.

A substrate 21 is obtained by laminating a N− type epitaxial layer 21b on a N+ type semiconductor substrate 21a. On the N− type epitaxial layer 21b which is exposed through an opening of an insulating film 60, a Schottky metal layer 25 is provided, which forms a Schottky junction with a surface thereof. This metal layer is, for example, Ti. Furthermore, an Al layer to be an anode electrode 28 by covering the entire metal layer 25 is provided thereon. In a periphery of the semiconductor substrate 21, a guard ring 27 having P+ type impurities diffused therein is provided to secure a breakdown voltage. A part of the guard ring 27 comes into contact with the Schottky metal layer 25. On a rear surface of the substrate 21, a cathode electrode 29 is provided. This technology is described for instance in Japanese Patent Application Publication No. Hei 6 (1994)-224410 (Page 2, FIG. 2).

Moreover, a structure of a Schottky Barrier diode 120 shown in FIGS. 7A and 7B is also known. FIG. 7A is a cross-sectional view, and FIG. 7B is a partially enlarged view of the cross section.

A substrate 31 is obtained by laminating a N− type epitaxial layer 31b on a N+ type semiconductor substrate 31a. In the N− type epitaxial layer 31b, a plurality of P+ type regions 33 are provided. On the N− type epitaxial layer 31b which is exposed through opening of an insulating film 60, a Schottky metal layer 35 is provided, which forms a Schottky junction with a surface thereof. This metal layer is, for example, Ti. Furthermore, an Al layer to be an anode electrode 38 by covering the entire metal layer 35 is provided thereon. In a periphery of the semiconductor substrate 31, a guard ring 37 having P+ type impurities diffused therein is provided to secure a breakdown voltage. A part of the guard ring 37 comes into contact with the Schottky metal layer 35. On a rear surface of the substrate 31, a cathode electrode 39 is provided.

When a reverse bias is applied to the Schottky barrier diode 120, as shown in FIG. 7B, a depletion layer 40 is spread into the N− type epitaxial layer 31b from the P+ type regions 33. A distance between the adjacent P+ type regions 33 is set to not more than a width at which the depletion layer is pinched off. Accordingly, even if a leak current occurs in a Schottky junction region when the reverse bias is applied, the depletion layer 40 shuts off the leak current. Specifically, without giving too much consideration to leak current characteristics, as characteristics of the Schottky metal layer 35, one with low forward voltage characteristics can be selected. This technology is described for instance in Japanese Patent Application Publication No. 2000-261004 (Pages 2 to 4, FIGS. 1 and 3).

A factor in determining characteristics of the Schottky barrier diode 110 having the structure shown in FIGS. 6A and 6B is a work function difference $\phi$ Bn between the N− type epitaxial layer 21b and the Schottky metal layer 25. However, since the work function difference $\phi$ Bn is a value unique to metal, the characteristics are almost determined by the Schottky metal layer 25 to be used.

Furthermore, in the case of considering a certain Schottky barrier diode, when $\phi$ Bn is increased, a forward voltage VF of the Schottky barrier diode is increased, and, on the contrary, a leak current IR at a reverse voltage is reduced. Specifically, the forward voltage VF characteristic and the leak current IR characteristic are in a trade-off relationship.

Even if the structure utilizing the pinch-off of the depletion layer 40 as shown in FIGS. 7A and 7B is theoretically possible, it is difficult, in reality, to completely shut off a current path only by use of the depletion layer 40. The depletion layer 40 is generated by voltage application. Particularly, in a Schottky barrier diode with a breakdown voltage of about 40V, for example, since the epitaxial layer 31b has a low resistivity, the depletion layer 40 is unlikely to be spread and may not be spread sufficiently as designed. For example, in the structure shown in FIGS. 7A and 7B, if there is even one region where the depletion layer 40 is not spread sufficiently enough to be pinched off, it is impossible to suppress the leak current. Moreover, when the forward bias is applied, the P+ type regions 33 are regions which are not operated as the Schottky barrier diode. Specifically, if the P+ type regions 33 are provided too closely to each other in order to complete the pinch-off, an area of the Schottky junction between the Schottky metal layer 35 and the N− type epitaxial layer 31b is reduced. Accordingly, there arises a problem that the forward voltage is deteriorated and switching time is increased.

SUMMARY OF THE INVENTION

The invention provides a semiconductor device that includes a semiconductor substrate of a first general conductivity type, a plurality of impurities regions of a second general conductivity type formed in the semiconductor substrate so as to define depletion regions in which depletion layers are formed around corresponding impurity regions under a reverse bias, a patterned metal layer of a first metal that is in contact with portions of the semiconductor substrate where the depletion layers are not formed under the reverse bias, and a metal layer of a second metal that is in contact with portions of the semiconductor substrate corresponding to the impurity regions and the depletion regions.

The invention also provides a method of manufacturing a semiconductor device. The method includes providing a semiconductor substrate of a first general conductivity type, forming a plurality of impurity regions of a second general conductivity type in the semiconductor substrate, forming a patterned metal layer so that a Schottky junction is formed between the patterned metal layer and the semiconductor substrate at portions of the semiconductor substrate away from the impurity regions by a predetermined distance, and forming a metal layer so that another Schottky junction is formed between the metal layer and portions of the semiconductor substrate that are exposed through the patterned metal layer.

DESCRIPTION OF THE EMBODIMENTS

With reference to FIGS. 1 to 5, an embodiment of the present invention will be described in detail.

Figure 1:
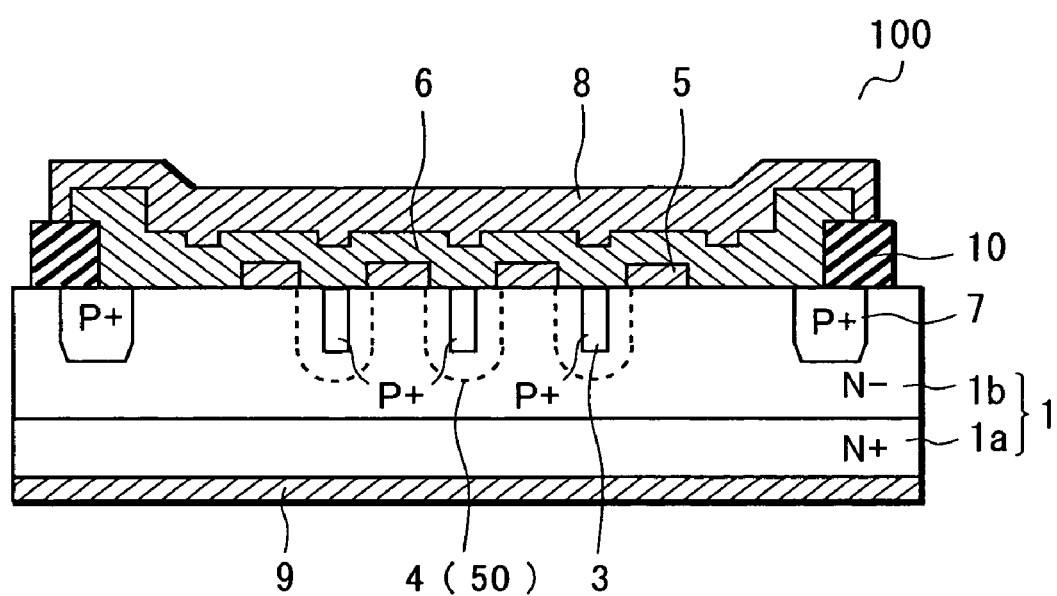
FIG. 1 is a cross-sectional view showing a semiconductor device according to an embodiment of the invention.
Figure 2A:
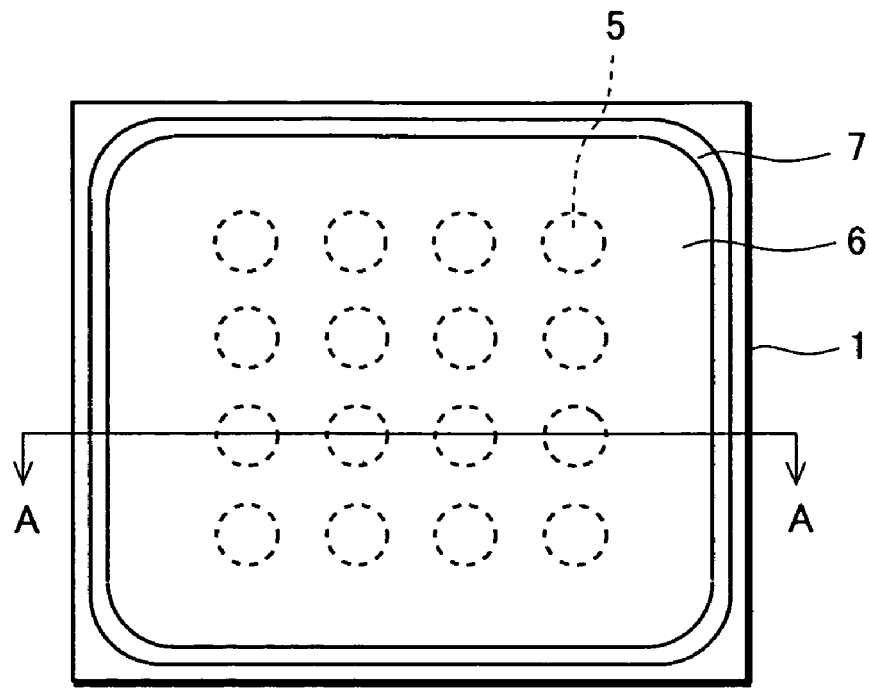
FIGS. 2A and 2B are plan views showing the semiconductor device according to the embodiment of the invention.
Figure 2B:
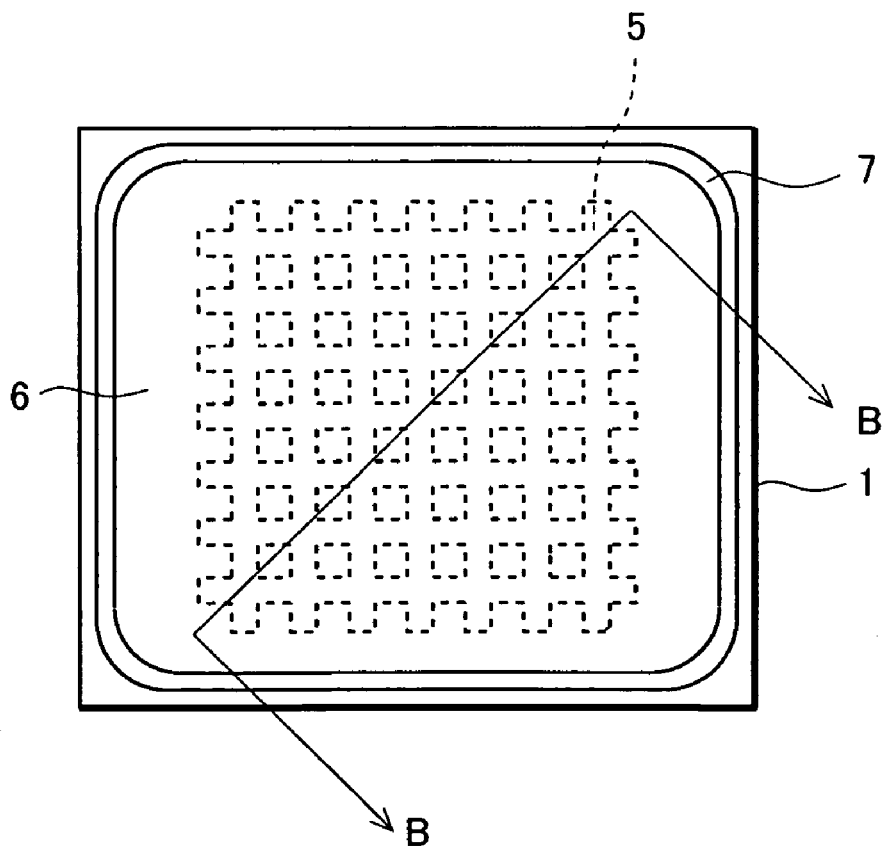

FIG. 1 and FIGS. 2A and 2B show a Schottky barrier diode according to the embodiment of the present invention. FIG. 1 is a cross-sectional view, and FIGS. 2A and 2B are plan views. Moreover, FIG. 1 corresponds to a cross-sectional view along the line A-A in FIG. 2A or a cross-sectional view along the line B-B in FIG. 2B. Furthermore, in FIGS. 2A and 2B, an anode electrode on a surface of a substrate is omitted. The Schottky barrier diode 100 of the preferred embodiment includes a one conductivity type semiconductor substrate 1, opposite conductivity type regions 3, a first metal layer 5, and a second metal layer 6.

The semiconductor substrate 1 is obtained by laminating a N– type epitaxial layer 1b on a N+ type semiconductor substrate 1a.

The opposite conductivity type regions 3 are a plurality of P+ type regions provided in the epitaxial layer 1b. P+ type impurities are injected and diffused in the epitaxial layer 1b, a width of each of the regions is set to, for example, about 10 μm to 15 μm, and a distance between P+ type region 3 and another P+ type region 3 is set to about 15 μm. Note that this distance is appropriately selected in consideration for a width of a depletion region 4 to be described later, a Schottky junction area, and the like.

Moreover, the P+ type regions 3 may be obtained in such a manner that trenches are formed in the epitaxial layer 1b, polysilicon doped with the P+ type impurities is buried in the trenches, and the P+ type impurities are diffused around the trenches by heat treatment. The method for forming the trenches facilitates line and space control.

In the N– type epitaxial layer 1b around the P+ type regions 3, depletion layers 50 are spread as indicated by the broken lines when a reverse bias is applied. The depletion layers 50 are controlled to be spread by about several μm, for example, from the P+ type regions 3. In the present specification, even in a state where the depletion layers 50 are not spread or not fully spread, regions where the depletion layers 50 are supposed to be spread to the maximum (about several μm from the P+ type regions 3) as indicated by the broken lines are called the depletion regions 4. Moreover, in this embodiment, the depletion region 4 and another depletion region 4 are separated from each other by a predetermined distance, and are not pinched off by the depletion layers 50 when the reverse bias is applied. In other words, the P+ type regions 3 and the depletion regions 4 are provided so as not to be pinched off.

The first metal layer 5 is a Schottky metal layer which forms a Schottky junction with the epitaxial layer 1b exposed between the depletion region 4 and another depletion region 4. The first Schottky metal layer 5 is made of metal (for example, Mo) which has a large work function difference φ Bn from the epitaxial layer 1b, and has a characteristic that a leak current IR is low (hereinafter referred to as a low IR characteristic) when the reverse bias is applied.

As shown in FIGS. 2A and 2B, the first Schottky metal layer 5 is provided in an island form (FIG. 2A) or in a lattice form (FIG. 2B) so as to completely cover the epitaxial layer 1b between the depletion region 4 and another depletion region 4.

However, as described later, if a formation region of the first Schottky metal layer 5 is excessively too large with respect to the depletion regions 4, a current path is blocked when a forward bias is applied. Specifically, the first Schottky metal layer 5 is provided to have a minimum area within a range that can completely cover the depletion regions 4. Note that, as schematically shown in FIG. 1 and FIGS. 2A and 2B, a number of the P+ type regions 3 and the first Schottky metal layers 5 may be provided. The first Schottky metal layer 5 may be provided in a continuous lattice manner, since the current is dispersed, compared to the case where the first Schottky metal layer 5 is provided in the form of individual islands.

The second metal layer 6 is a Schottky metal layer provided so as to entirely cover at least the P+ type regions 3 and the depletion regions 4 which are exposed between the first Schottky metal layers 5. The second metal layer 6 may be patterned so as to be adjacent to the first Schottky metal layer 5. However, as shown in FIG. 1, it is efficient to provide the second metal layer 6 so as to cover the first Schottky metal layer 5, since it is no longer required to consider misalignment therebetween.

Moreover, for the second Schottky metal layer 6, metal (for example, Ti) which has a smaller work function difference φ Bn from the epitaxial layer 1b than that of the first Schottky metal layer 5 is used. A metal layer having a small work function difference φ Bn has a characteristic that a forward voltage VF is low (hereinafter referred to as a low VF characteristic).

In a periphery of the semiconductor substrate 1, a guard ring 7 is provided, which is made of a high-concentration P-type region. The guard ring 7 is provided to secure a breakdown voltage by relieving field concentration caused in an edge portion of the Schottky junction by the depletion layer spread from the Schottky barrier when the reverse bias is applied.

On the first and second Schottky metal layers 5 and 6, an Al layer or the like, for example, is provided as an anode electrode 8. On a rear surface of the N+ type semiconductor substrate 1, a cathode electrode 9 is provided.

Figure 3A:
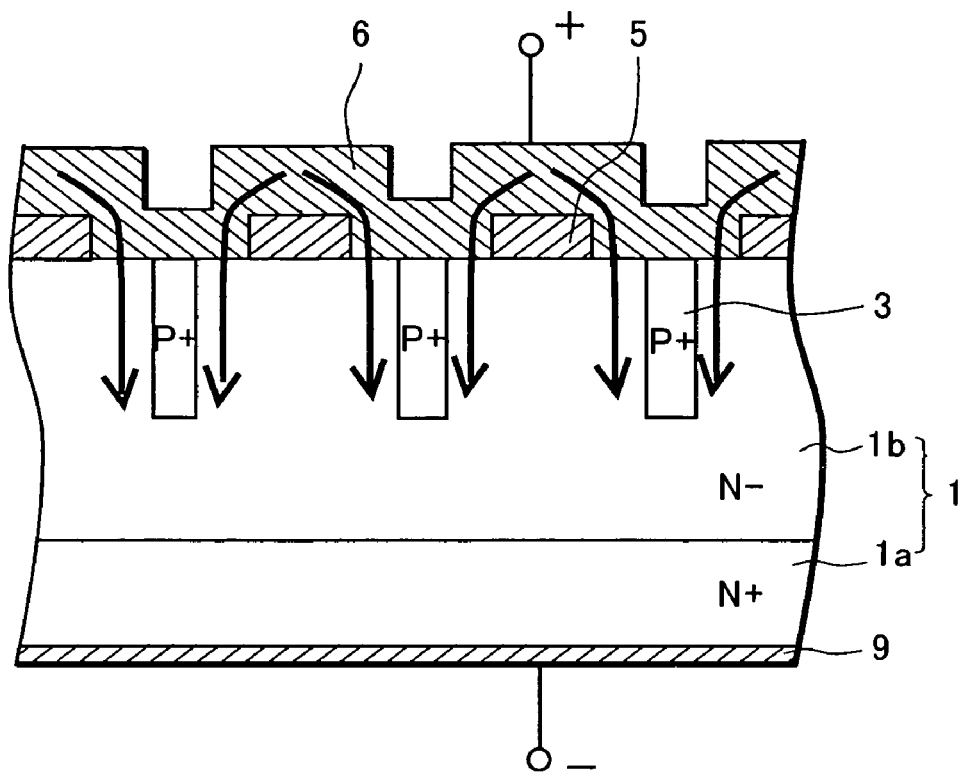
FIGS. 3A and 3B are cross-sectional views showing the semiconductor device according to the embodiment of the invention.
Figure 3B:
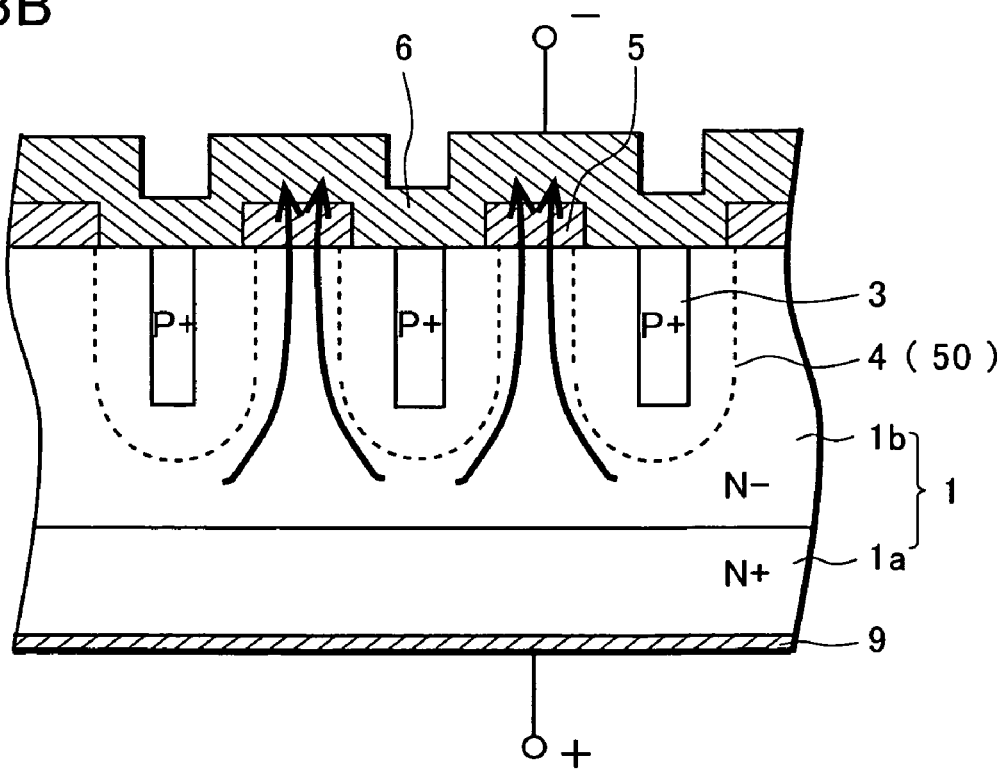
Figure 4:
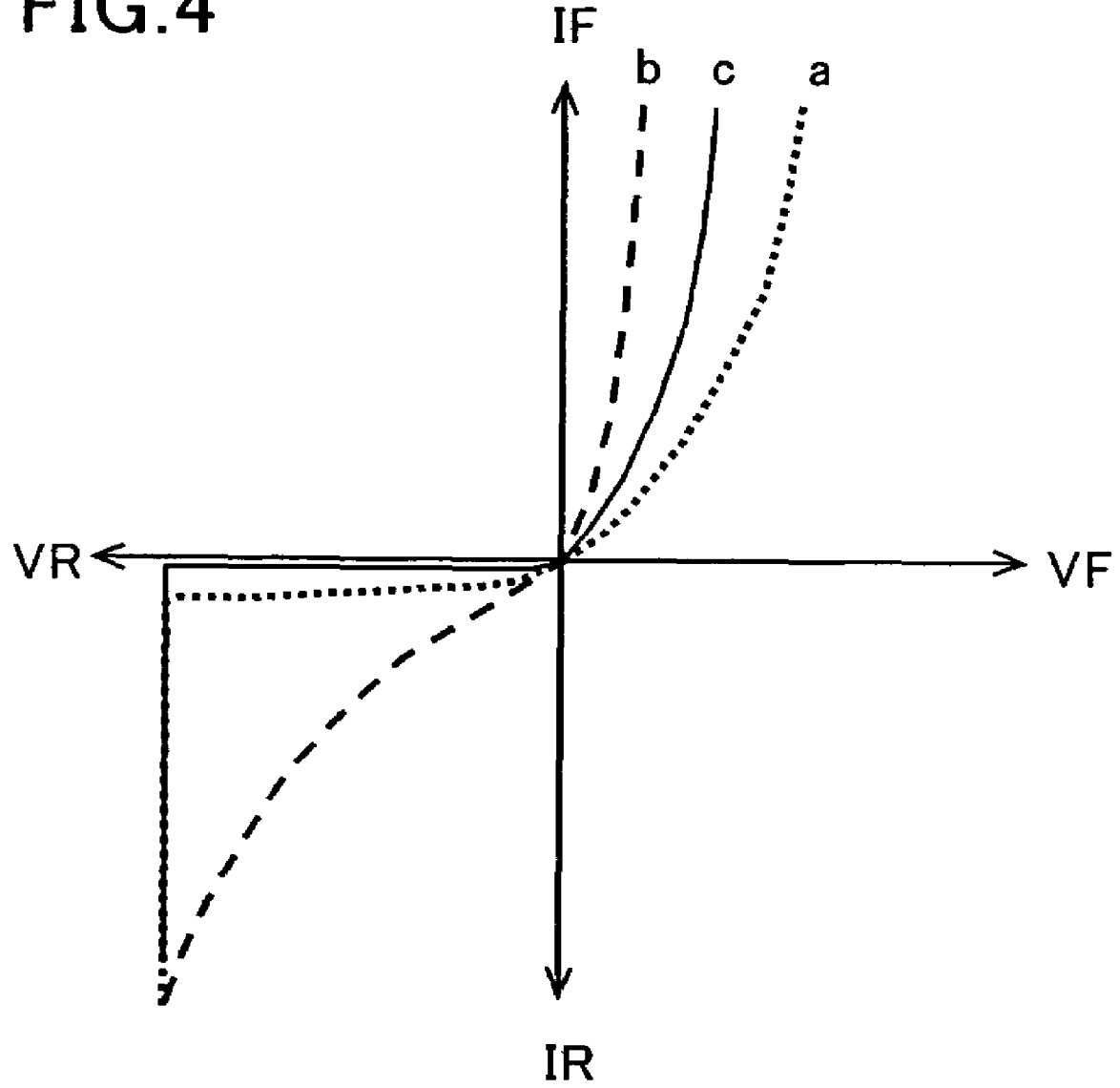
FIG. 4 is a characteristic diagram for explaining the semiconductor device according to the embodiment of the invention and a conventional semiconductor device.

With reference to FIGS. 3 and 4, operations of the above-described Schottky barrier diode 100 will be described.

FIGS. 3A and 3B are enlarged cross-sectional views of an operation region. FIG. 3A is a schematic view when the forward bias is applied, and FIG. 3B is a schematic view when a reverse bias is applied.

First, when the forward bias is applied as shown in FIG. 3A, a voltage is applied to the first and second Schottky metal layers 5 and 6. On the surface of the epitaxial layer 1b, there are a Schottky junction region of the first Schottky metal layer 5 and a Schottky junction region of the second Schottky metal layer 6. The forward voltage VF of the second Schottky metal layer 6 is lower than the forward voltage VF of the first Schottky metal layer 5. Since the Schottky barrier diode is operated at the low VF characteristic when the forward bias is applied, a current path is formed as indicated by the arrows in FIG. 3A. Specifically, the Schottky barrier diode 100 is operated according to the forward voltage VF characteristic of the second Schottky metal layer 6 (Ti).

Next, when the reverse bias is applied to the Schottky barrier diode 100 as shown in FIG. 3B, PN junctions between the P+ type regions 3 and the N− type epitaxial layer 1b cause the depletion layers 50 to be spread in the epitaxial layer 1b between the P+ type regions 3. As described above, the P+ type regions 3 are arranged while being equally spaced apart at predetermined intervals. Thus, in this embodiment, the pinch-off is not caused by the depletion layers as described above, and the depletion layers 50 are spread up to the depletion regions 4.

Specifically, a current path in this case is selectively formed, as indicated by the arrows, only in the Schottky junction region of the first Schottky metal layer 5 due to the depletion regions 4. Therefore, when the reverse bias is applied, the current flows through the first Schottky metal layer 5 (Mo) which has a characteristic that a leak current IR is low (hereinafter a low IR characteristic), and the Schottky barrier diode 100 is operated according to the low IR characteristic.

As described above, by use of the two kinds of metal layers having the low VF characteristic and the low IR characteristic, respectively, such as Ti and Mo, for example, the current path is controlled by the depletion layers 50. Accordingly, when the forward bias is applied, the diode can be operated according to the low VF characteristic of Ti, and, when the reverse bias is applied, the diode can be operated according to the low IR characteristic of Mo. Specifically, it is possible to provide the Schottky barrier diode 100 substantially having the low VF characteristic and the low IR characteristic as a whole.

Note that the first and second Schottky metal layers 5 and 6 are not limited to those described above. If the first Schottky metal layer 5 has a work function difference φ Bn larger than that of the second Schottky metal layer 6, the low VF characteristic is obtained when the forward bias is applied, and the low IR characteristic is obtained when the reverse bias is applied. Moreover, needless to say, not only whether the work function difference φ Bn is large or small, the lower the forward voltage VF is, the better the first Schottky metal layer 5 is, and the lower the leak current IR is, the better the second Schottky metal layer 6 is.

The Schottky barrier diode may have a larger Schottky junction area between the Schottky metal layers and the epitaxial layer 1b, since the forward voltage VF can be lowered. However, the P+ type regions 3 become ineffective regions when the forward bias is applied to the Schottky barrier diode 100.

Specifically, a junction area between the second Schottky metal layer 6 and the epitaxial layer 1b, the area being the current path when the forward bias is applied, is set as large as possible. As measures, for example, the width of each of the P+ type regions 3 is set as narrow as possible so that the junction area between the second Schottky metal layer 6 and the epitaxial layer 1b may be set as large as possible. Moreover, the area (width) of the depletion region 4 may be increased by reducing the impurity concentration of the N− type epitaxial layer 1b. The area of the first Schottky metal layer 5 can be reduced as much as the depletion region 4 is increased. Thus, the junction area between the second Schottky metal layer 6 and the surface of the epitaxial layer 1b can be set as large as possible. Moreover, the measures described above may be combined.

FIG. 4 shows a characteristic diagram of a Schottky barrier diode having a conventional structure and the Schottky barrier diode 100 of this embodiment. FIG. 4 shows a relationship between a forward voltage VF and a forward current IF, and a relationship between a reverse voltage VR and a leak current IR. Note that the both Schottky barrier diodes have the same chip size.

Figure 6A:
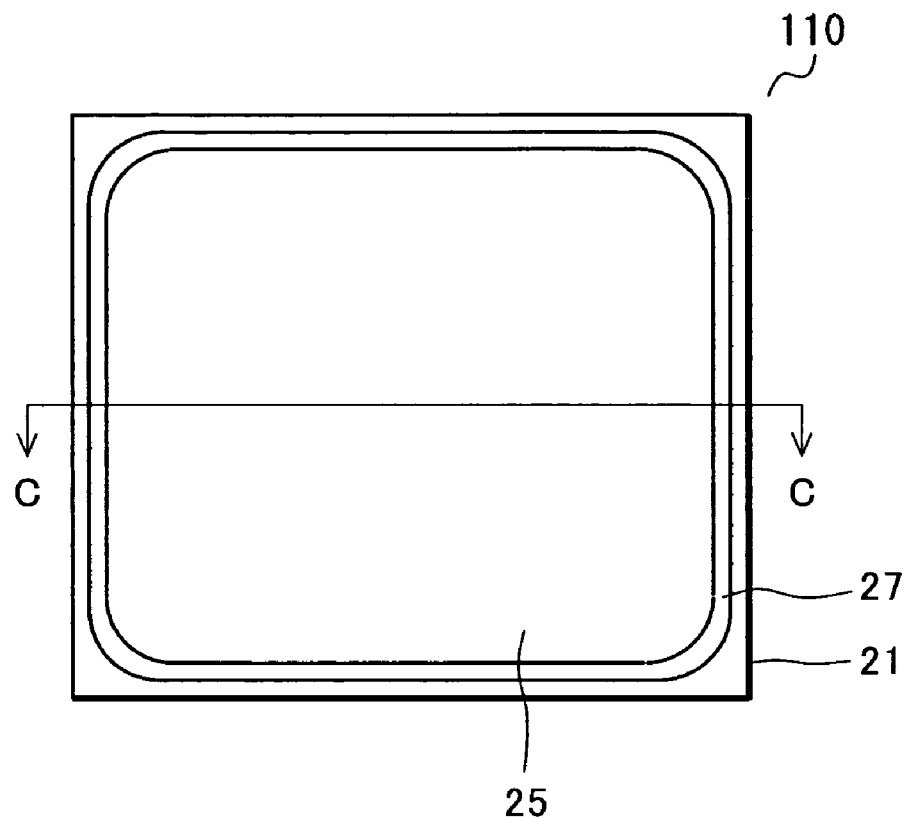
FIG. 6A is a plan view and FIG. 6B is a cross-sectional view showing the conventional semiconductor device.
Figure 6B:
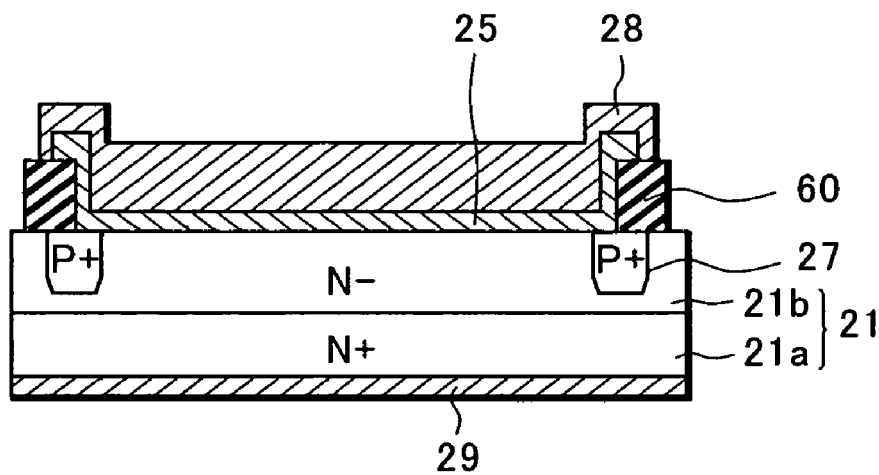
Figure 7A:
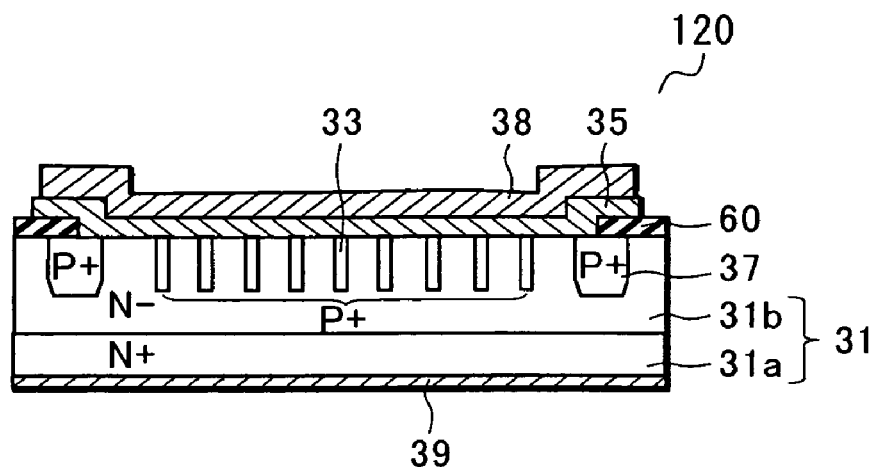
FIGS. 7A and 7B are cross-sectional views showing the conventional semiconductor device.
Figure 7B:
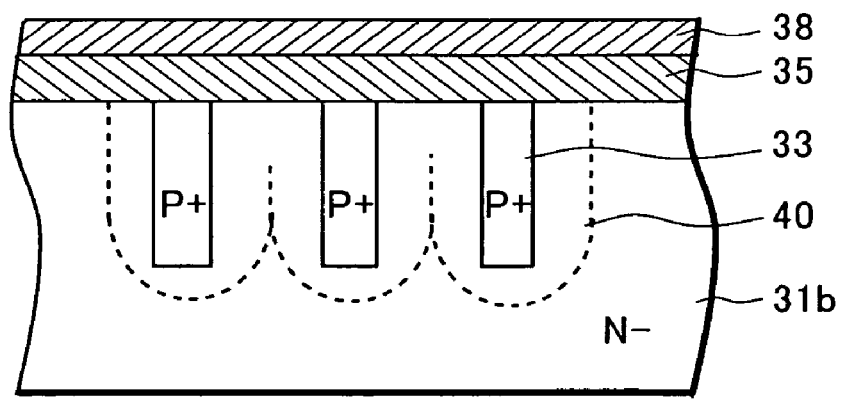

The broken line a in FIG. 4 indicates the conventional Schottky barrier diode 110 shown in FIGS. 6A and 6B. The Schottky barrier diode 110 has a structure using a metal layer (Mo) with a large work function difference φ Bn as the Schottky metal layer 25. The broken line b indicates the Schottky barrier diode 110 having a structure using a metal layer (Ti) with a small work function difference φ Bn as the Schottky metal layer 25. Meanwhile, the solid line c indicates the Schottky barrier diode 100, in which Mo is adopted as the first Schottky metal layer 5 and Ti is adopted as the second Schottky metal layer 6 as described above.

In the conventional structure, if only Mo is adopted as the Schottky metal layer 25, the leak current IR is low but the forward voltage VF is high as indicated by the broken line a. Meanwhile, if only Ti is adopted as the Schottky metal layer 25, the forward voltage VF is low but the leak current IR is high as indicated by the broken line b.

On the other hand, according to the structure of this embodiment, the Schottky junction area is somewhat reduced by providing the P+ type regions 3, and the forward voltage VF is higher than that indicated by the broken line b. However, when the forward bias is applied, the forward voltage VF is lower than that indicated by the broken line a. Moreover, when the reverse bias is applied, the leak current IR is lower than those indicated by the broken lines a and b.

Next, with reference to FIGS. 5A to 5D, a method for manufacturing a semiconductor device according to an embodiment of the present invention will be described in detail.

The method for manufacturing a semiconductor device of the preferred embodiment includes: a step of forming a plurality of opposite conductivity type regions in a one conductivity type semiconductor substrate; and a step of forming first metal layers which form a Schottky junction with a surface of the semiconductor substrate separated from the opposite conductivity type regions by a predetermined distance, and forming a second metal layer which forms a Schottky junction with the substrate surface exposed between the first metal layers.

The first step (FIGS. 5A and 5B): the step of forming the plurality of opposite conductivity type regions in the one conductivity type semiconductor substrate.

A semiconductor substrate 1 is prepared by laminating a N− type epitaxial layer 1b on a N+ type semiconductor substrate 1a, and an oxide film (not shown) is formed on the entire surface of the N− type epitaxial layer 1b.

Openings are formed in predetermined positions of the oxide film, and P+ type impurities are injected and diffused in the surface of the epitaxial layer 1b. Thus, a plurality of P+ type regions 3 are formed at even intervals. The P+ type regions 3 are separated from each other by a predetermined distance (for example, about 15 μm from each edge). Moreover, a width of the P+ type region 3 is set to, for example, about 10 μm to 15 μm. The P+ type regions 3 are formed by controlling the width of the P+ type region 3, the distance between the P+ type regions 3, and a width of depletion region 4 (the impurity concentration in the P+ type regions and the epitaxial layer 1b) so as to allow the depletion region 4 (see FIG. 1) not to come into contact with another depletion region 4 adjacent thereto if depletion layers 50 are spread into the epitaxial layer 1b from the P+ type regions 3 when the reverse bias is applied.

Meanwhile, the P+ type regions 3 may be formed to be as narrow as possible so as to have a Schottky junction area as large as possible between a second Schottky metal layer 6 and the epitaxial layer 1*b*, the area being formed in the following step.

Next, guard ring 7 is formed. The guard ring 7 is provided to secure a breakdown voltage by relieving a curvature of the depletion layer 50 in a peripheral region. Specifically, if there is no problem in terms of characteristics even under the same diffusion condition as that of the P+ type regions 3, the guard ring 7 can be formed in the same step as that of the P+ type regions 3. Meanwhile, if diffusion is insufficient under the same diffusion condition as that of the P+ type regions 3 in a device used for a high breakdown voltage, the guard ring 7 is formed by separately performing an injection and diffusion step after the P+ type regions 3 are formed.

Figure 5A:
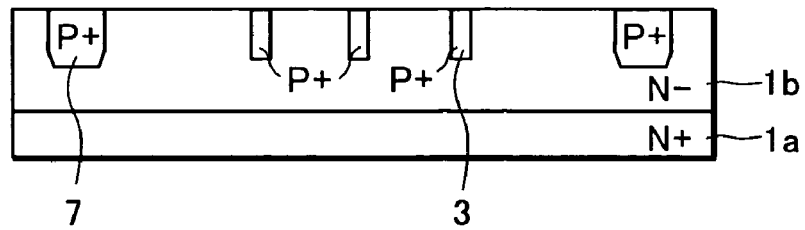
FIGS. 5A to 5D are cross-sectional views showing a method for manufacturing a semiconductor device of the embodiment.
Figure 5B:
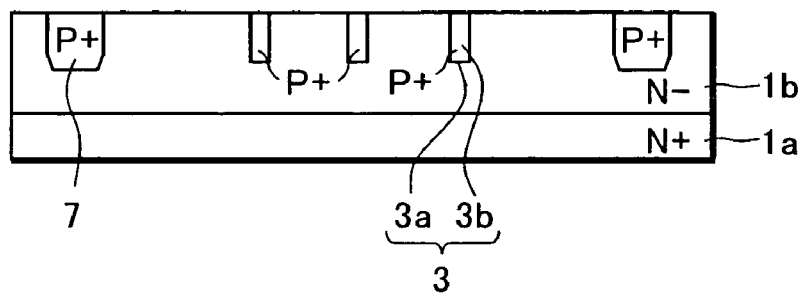

Here, as shown in FIG. 5B, the P+ type regions 3 may be formed by forming trenches 3*a* of about several μm, burying polysilicon 3*b* doped with the P+ type impurities in the trenches 3*a*, and diffusing the impurities around the trenches 3*a* by heat treatment. This method facilitates miniaturization of the P+ type regions 3 compared to the case of formation by diffusion.

The second step (FIGS. 5C and 5D): the step of forming the first metal layer which forms the Schottky junction with the surface of the semiconductor substrate separated from the opposite conductivity type regions by the predetermined distance, and forming the second metal layer which forms the Schottky junction with the substrate surface exposed between the first metal layers.

By performing a diffusion step and the like, a part of an oxide film 10 provided to the entire surface is removed. Accordingly, the Schottky junction regions, in other words, all the P+ type regions 3 and the surface of the epitaxial layer 1*b* are exposed. Moreover, a part of the guard ring 7 is also exposed so as to allow contact of the Schottky metal layers.

Figure 5C:
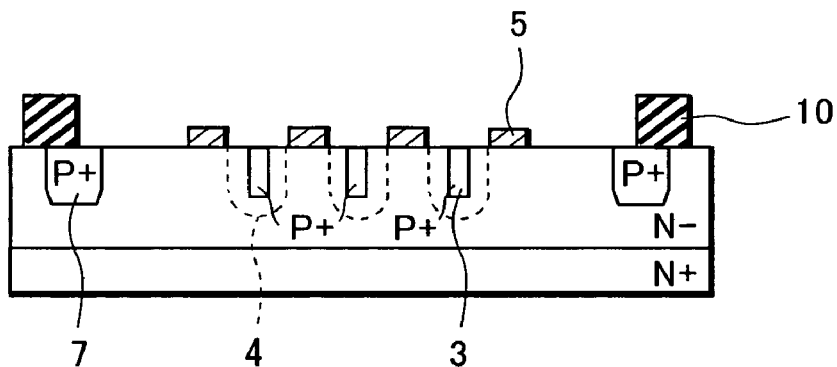

First, Mo, for example, to be a first Schottky metal layer 5 is evaporated on the entire surface and is patterned so as to remain on the surface of the epitaxial layer 1*b* exposed between the depletion region 4 and another depletion region 4. The first Schottky metal layer 5 may be patterned, for example, in an island form or in a lattice form (FIG. 5C).

Next, the second metal, for example, Ti is evaporated on the entire surface to form the second Schottky metal layer 6 which comes into contact with the exposed surface of the epitaxial layer 1*b*. Since the second Schottky metal layer 6 is evaporated on the entire surface, the second Schottky metal layer 6 is also provided on the first Schottky metal layer 5.

Figure 5D:
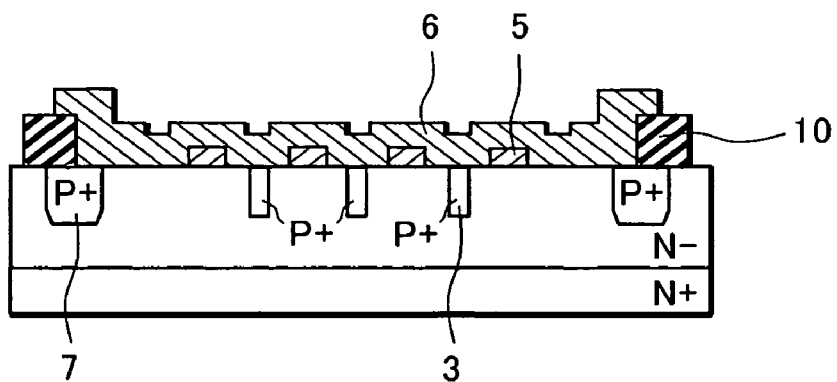

Thereafter, anneal processing is performed at about 400° C. to 600° C., for example, to simultaneously silicify interfaces between the first and second Schottky metal layers 5 and 6 and the epitaxial layer 1*b*. Thus, the Schottky junctions are formed between the first Schottky metal layer 5 and the surface of the epitaxial layer 1*b* and between the second Schottky metal layer 6 and the surface of the epitaxial layer 1*b* (the P+ type regions 3 and the depletion regions 4) (FIG. 5D).

As described above, in this embodiment, the two kinds of Schottky metal layers are used. The metal layers can be simultaneously silicified by a single heat treatment. However, depending on metal to be used, a plurality of times of anneal processing may be separately performed.

Thereafter, an Al layer or the like to be an anode electrode 8 is evaporated on the entire surface and patterned into a desired shape. On a rear surface of the substrate 1, a cathode electrode 9 such as Ti/Ni/Au, for example, is formed. Thus, the final structure shown in FIG. 1 is obtained.

What is claimed is:

1. A semiconductor device comprising:
   a semiconductor substrate of a first general conductivity type;
   a plurality of impurity regions of a second general conductivity type formed in the semiconductor substrate so as to define depletion regions in which depletion layers are formed around corresponding impurity regions under a reverse bias;
   a patterned metal layer of a first metal that is in contact with portions of the semiconductor substrate where the depletion layers are not formed under the reverse bias; and
   a metal layer of a second metal that is in contact with portions of the semiconductor substrate corresponding to the impurity regions and the depletion regions,
   wherein the patterned metal layer of the first metal forms a Schottky junction with the semiconductor substrate and the metal layer of the second metal forms another Schottky junction with the semiconductor substrate,
   a difference in work function between the first metal and the semiconductor substrate is larger than a difference in work function between the second metal and the semiconductor substrate, and
   the metal layer of the second metal completely covers the impurity regions of the second general conductivity type in plan view of the semiconductor device.

2. The semiconductor device of claim 1, wherein the impurity regions comprise regions formed by diffusing impurities of the second general conductivity type in the substrate.

3. The semiconductor device of claim 1, wherein the impurity regions comprise trenches formed in the semiconductor substrate and filled with semiconductor material of the second general conductivity type.

4. The semiconductor device of claim 1, wherein the impurity regions are arranged at even intervals.

5. A method for manufacturing a semiconductor device, comprising:
   providing a semiconductor substrate of a first general conductivity type;
   forming a plurality of impurity regions of a second general conductivity type in the semiconductor substrate;
   forming a patterned metal layer so that a Schottky junction is formed between the patterned metal layer and the semiconductor substrate at portions of the semiconductor substrate away from the impurity regions by a predetermined distance; and
   forming a metal layer to cover the patterned metal layer so that another Schottky junction is formed between the metal layer and portions of the semiconductor substrate that are exposed through the patterned metal layer.

6. The method of claim 5, wherein further comprising annealing to form the Schottky junction and the another Schottky junction simultaneously.

* * * * *